US011800700B2

(12) United States Patent
Lu

(10) Patent No.: US 11,800,700 B2
(45) Date of Patent: Oct. 24, 2023

(54) MEMORY AND ITS MANUFACTURING METHOD

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 55 days.

(21) Appl. No.: 17/476,596

(22) Filed: Sep. 16, 2021

(65) Prior Publication Data

US 2022/0068938 A1 Mar. 3, 2022

Related U.S. Application Data

(63) Continuation of application No. PCT/CN2021/103802, filed on Jun. 30, 2021.

(30) Foreign Application Priority Data

Aug. 26, 2020 (CN) .......................... 202010872680.1

(51) Int. Cl.
*H10B 12/00* (2023.01)
(52) U.S. Cl.
CPC ....... *H10B 12/0335* (2023.02); *H10B 12/315* (2023.02); *H10B 12/482* (2023.02)
(58) Field of Classification Search
CPC ............................ H10B 12/0335; H10B 12/482
See application file for complete search history.

(56) References Cited

U.S. PATENT DOCUMENTS

| 7,476,920 B2 | 1/2009 | Schloesser |
| 2002/0098699 A1 | 7/2002 | Chern et al. |
| 2004/0043542 A1* | 3/2004 | Park .................. H01L 21/76831 |
| | | 257/E21.507 |
| 2005/0280035 A1 | 12/2005 | Lee et al. |

FOREIGN PATENT DOCUMENTS

| CN | 1534362 A | 10/2004 |
| CN | 1976001 A | 6/2007 |
| CN | 104649214 A | 5/2015 |
| CN | 106941097 A | 7/2017 |
| CN | 211017075 U | 7/2020 |

OTHER PUBLICATIONS

ISR Written Opinion for International Application PCT/CN2021/103802 dated Sep. 28, 2021.
Written Opinion for International Application PCT/CN2021/103802 dated Sep. 28, 2021.

* cited by examiner

*Primary Examiner* — Robert G Bachner
*Assistant Examiner* — Molly K Reida
(74) *Attorney, Agent, or Firm* — Ladas & Parry LLP

(57) ABSTRACT

Embodiments of the present disclosure provide a memory and its manufacturing method. The memory includes: a substrate with a plurality of mutually discrete bitlines, the bitline including a bitline conductive layer and a bitline insulating layer which are stacked in sequence; and an insulating layer and capacitor contact holes, the insulating layer being located on sidewalls of the bitline conductive layers and sidewalls of the bitline insulating layers, the capacitor contact holes being located between adjacent ones of the bitline conductive layers, sidewalls of the capacitor contact holes exposing the insulating layer, an opening size of the capacitor contact hole gradually increasing in a direction along the substrate and towards the insulating layer.

14 Claims, 7 Drawing Sheets

MEMORY AND ITS MANUFACTURING METHOD

CROSS-REFERENCE TO RELATED APPLICATIONS

This application is a continuation of International Patent Application No. PCT/CN2021/103802, filed on Jun. 30, 2021, which claims priority to Chinese Patent Application No. 202010872680.1, filed on Aug. 26, 2020. The entire contents of the aforementioned patent applications are hereby incorporated by reference in their entirety.

TECHNICAL FIELD

The present disclosure relates to the field of semiconductors, and in particular to a memory and its manufacturing method.

BACKGROUND

A memory is a memory component for storing programs and various types of data information. Memories can be divided into read-only memories and random access memories according to application types of the memories. A memory usually includes a capacitor and a transistor connected to the capacitor. The capacitor is configured to store a charge representing stored information, and the transistor serves as a switch that controls the charge to flow in and be released from the capacitor. The capacitor and the transistor are connected through capacitor contact plugs formed in capacitor contact holes.

However, when the capacitor contact holes in the memory are filled with a conductive material to form the capacitor contact plugs, an incomplete filling phenomenon is easily caused, which increases resistance of the capacitor contact plug, thereby affecting the electrical performance of the memory.

SUMMARY

The present disclosure provides a manufacturing method of a memory, including: providing a substrate with a plurality of mutually discrete bitline conductive layers; forming an insulating layer, the insulating layer covering the bitline conductive layers and filling a region between adjacent ones of the bitline conductive layers, a top surface of the insulating layer being higher than the bitline conductive layer, an etching rate of a subsequent second etching process for the insulating layer gradually increasing in a direction along the substrate and towards the insulating layer; carrying out a first etching process to etch the insulating layer located between the adjacent bitline conductive layers to form initial capacitor contact holes exposing the substrate; and carrying out the second etching process to etch the insulating layer on sidewalls of the initial capacitor contact holes to form capacitor contact holes, an opening size of the capacitor contact hole gradually increasing in the direction along the substrate and towards the insulating layer, the remaining insulating layer right above the bitline conductive layer serving as a bitline insulating layer.

The present disclosure further provides a memory, including: a substrate with a plurality of mutually discrete bitlines, the bitline including a bitline conductive layer and a bitline insulating layer which are stacked in sequence; and an insulating layer and capacitor contact holes, the insulating layer being located on sidewalls of the bitline conductive layers and sidewalls of the bitline insulating layers, the capacitor contact holes being located between adjacent ones of the bitline conductive layers, sidewalls of the capacitor contact holes exposing the insulating layer, an opening size of the capacitor contact hole gradually increasing in a direction along the substrate and towards the insulating layer.

DESCRIPTION OF EMBODIMENTS

Figure 1:
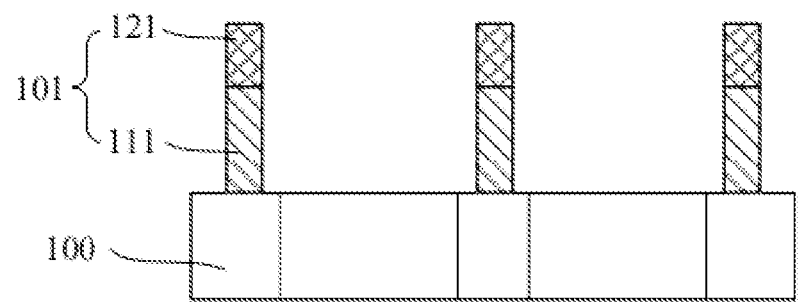
FIGS. 1 to 6 are schematic structural diagrams corresponding to various steps in a manufacturing method of a memory according to a first embodiment of the present disclosure.

Specific embodiments of a memory and its manufacturing method in the present disclosure will be described in detail below in conjunction with the accompanying drawings.

It can be known from the background section that there is currently a problem that the resistance of the capacitor contact plug is relatively large, which affects the electrical performance of the memory.

According to the analysis, the large resistance of the capacitor contact plug is caused by the following reason. Due to the relatively large depth and width of the capacitor contact hole, during the deposition process of forming a conductive material filling up the capacitor contact hole, when the inside of the capacitor contact hole is not completely filled, a top opening of the capacitor contact hole is blocked by the conductive material prematurely, and as a result, the formed capacitor contact plug has cavities therein, resulting in a large resistance of the capacitor contact plug.

In order to solve the cavity problem, the process steps of deposition-etch-deposition are usually carried out to form the capacitor contact plug. Specifically, first, a deposition process is carried out to form a first conductive layer filling up the capacitor contact holes, and the first conductive layer usually has cavities; the first conductive layer is etched until the cavities are exposed; then, a deposition process is carried out to form a second conductive layer on the remaining first conductive layer, and the second conductive layer and the remaining conductive layer serve as a capacitor contact plug. In addition, if there are cavities in the second conductive layer, the second conductive layer can also be etched until the cavities are exposed, and then the deposition process is performed again. However, although this method can solve the cavity problem, since the capacitor contact plug includes at least two conductive layers, an interface between the adjacent conductive layers will also affect the conductive performance of the capacitor contact plug, for example, impurity residues are likely to occur at the interface, which affects the conductive effect. The impurity residues may be etching byproducts or oxides. For example, when the conductive material is silicon, since there is a process time interval between the etching process and the deposition process, silicon oxide is easily formed at the interface during the process time interval, which will further increase the resistance of the capacitor contact plug.

In order to solve the above-mentioned problems, various embodiments of the present disclosure provide a memory and its manufacturing method. By changing the process temperature of the same deposition process or using different deposition processes, an insulating layer with gradually decreasing density in the direction along the substrate and towards the insulating layer is formed. In this way, during the second etching process, the width of the etched insulating layer on the sidewalls of the initial capacitor contact holes gradually increases within the same etching time, and then capacitor contact holes in a shape with a wide opening and a narrow bottom can be formed, which achieves a better filling effect of a conductive material in the capacitor contact hole and is beneficial to improving the conductive performance of the capacitor contact plug formed in the capacitor contact hole, thereby further improving the electrical performance of the memory structure.

In order to make the objectives, technical solutions, and advantages of the embodiments of the present disclosure more clear, various embodiments of the present disclosures will be detailed below in combination with the accompanying drawings. However, a person of ordinary skill in the art can understand that in each embodiment of the present disclosure, many technical details are provided for readers to better understand the present disclosure. However, even if these technical details are not provided and based on variations and modifications of the following embodiments, the technical solutions sought for protection in the present disclosure can also be implemented.

A first embodiment of the present disclosure provides a manufacturing method of a memory. The manufacturing method of a memory according to the first embodiment will be described in detail below with reference to the accompanying drawings. FIGS. 1 to 6 are schematic structural diagrams corresponding to various steps in the manufacturing method of a memory according to the first embodiment of the present disclosure.

Referring to FIG. 1, a substrate 100 is provided, and the substrate 100 is provided with a plurality of mutually discrete bitline conductive layers 101.

As a part of a bitline of the memory, the bitline conductive layer 101, together with a bitline insulating layer formed subsequently, functions as the bitline of the memory. Specifically, the substrate 100 has AAs (Active Area) therein, and the bitline conductive layer 101 is electrically connected to the AA.

The bitline conductive layer 101 may be of a film-stack structure, such as including a bitline contact window 111 and a bitline conductive post 121 which are stacked in sequence, and the bitline contact window 111 is in contact with the substrate 100. The bitline contact window 111 is made of a semiconductor conductive material such as polysilicon, or the like, and the bitline conductive post 121 is made of a metal conductive material such as tungsten, gold, silver, or the like. In addition, a diffusion barrier layer may further be formed between the bitline contact window 111 and the bitline conductive post 121, and the diffusion barrier layer may be made of tantalum nitride or titanium nitride.

It can be understood that, in other embodiments, the bitline conductive layer 101 may also be of a single-layer structure.

Figure 2:
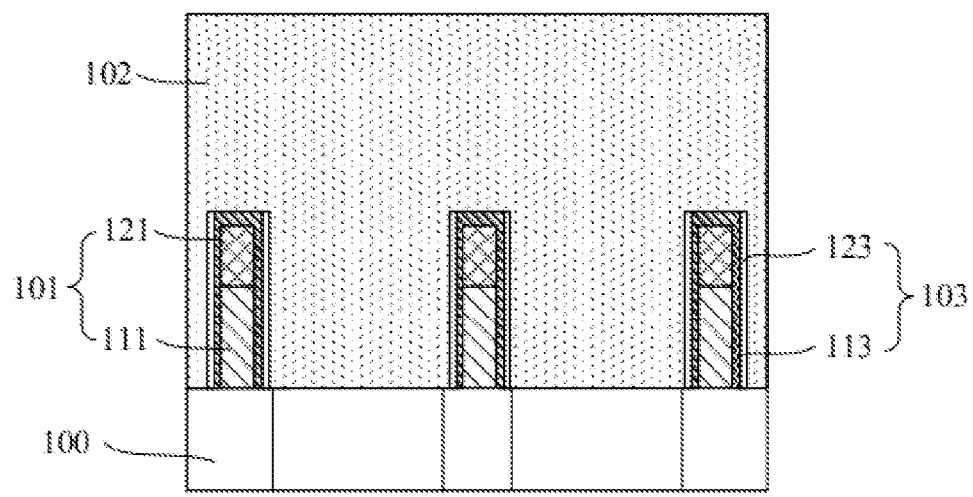

Referring to FIG. 2, an insulating layer 102 is formed to cover the bitline conductive layers 101 and fill a region between adjacent bitline conductive layers 101. A top surface of the insulating layer 102 is higher than the bitline conductive layer 101, and an etching rate of a subsequent second etching process for the insulating layer 102 gradually increases in a direction along the substrate 100 and towards the insulating layer 102.

The functions of the insulating layer 102 are as follows. On the one hand, the insulating layer 102 located right above the bitline conductive layer 101 will subsequently serve as the bitline insulating layer; on the other hand, the insulating layer 102 located between the adjacent bitline conductive layers 101 will be subsequently used to electrically isolate the capacitor contact hole from the bitline conductive layer 101; moreover, based on the characteristic that the etching rate of the subsequent second etching process for the insulating layer 102 gradually increases, capacitor contact holes of a special shape can be formed.

The lower the density of the insulating layer 102, the greater the etching rate of the subsequent second etching process for the insulating layer 102. Therefore, in this embodiment, the density of the insulating layer 102 gradually decreases in the direction along the substrate 100 and towards the insulating layer 102, so that the etching rate of the subsequent second etching process for the insulating layer 102 gradually increases. Specifically, the insulating layer 102 is of a single-layer structure, and the farther the insulating layer 102 is from the substrate 100, the lower the density of the insulating layer 102 is. The insulating layer 102 is formed by a deposition process, and the process temperature of the deposition process gradually decreases, so that the density of the formed insulating layer 102 gradually decreases, and a height of the insulating layer 102 in the direction along the substrate 100 and towards the insulating layer 102 is within a range of 100 nm to 300 nm.

In this embodiment, the deposition process is a chemical vapor deposition process. In other embodiments, the deposition process may also be a physical vapor deposition process or an atomic layer deposition process.

In this embodiment, the insulating layer 102 is made of silicon nitride. In other embodiments, the insulating layer 102 may also be made of silicon oxide, silicon oxynitride, or silicon carbon oxynitride.

In this embodiment, before forming the insulating layer 102, the method further includes: forming an isolation layer 103 on a top of the bitline conductive layer 101 and sidewalls of the bitline conductive layer 101. The isolation layer 103 can protect the bitline conductive layer 101 and further improve insulativity between the bitline conductive layer 101 and capacitor contact plugs formed subsequently. Specifically, the isolation layer 103 may be of a film-stack structure, such as including a silicon nitride layer 113 and a silicon oxide layer 123 which are stacked in sequence. In other embodiments, the isolation layer 103 may also be of a single-layer structure.

Figure 3:
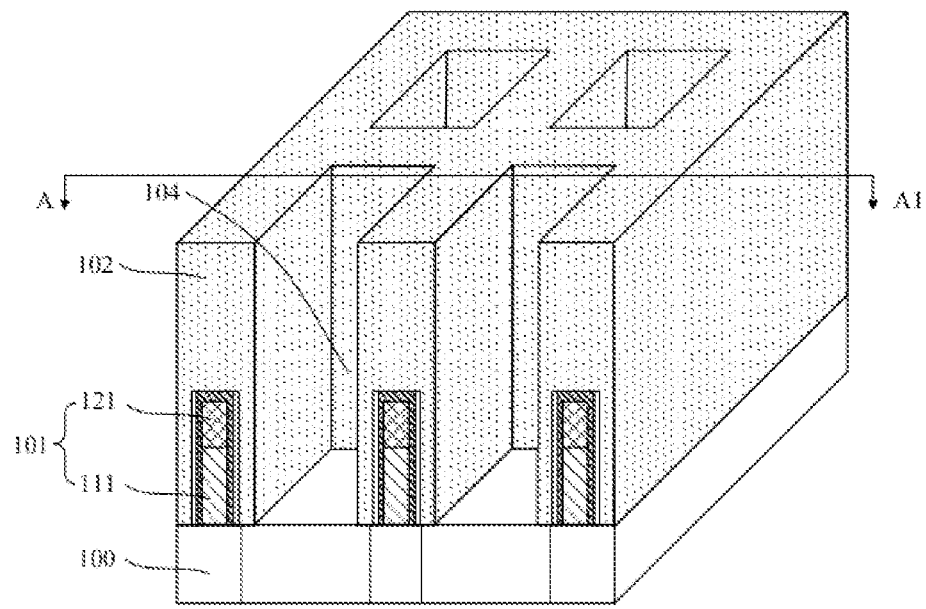
Figure 4:
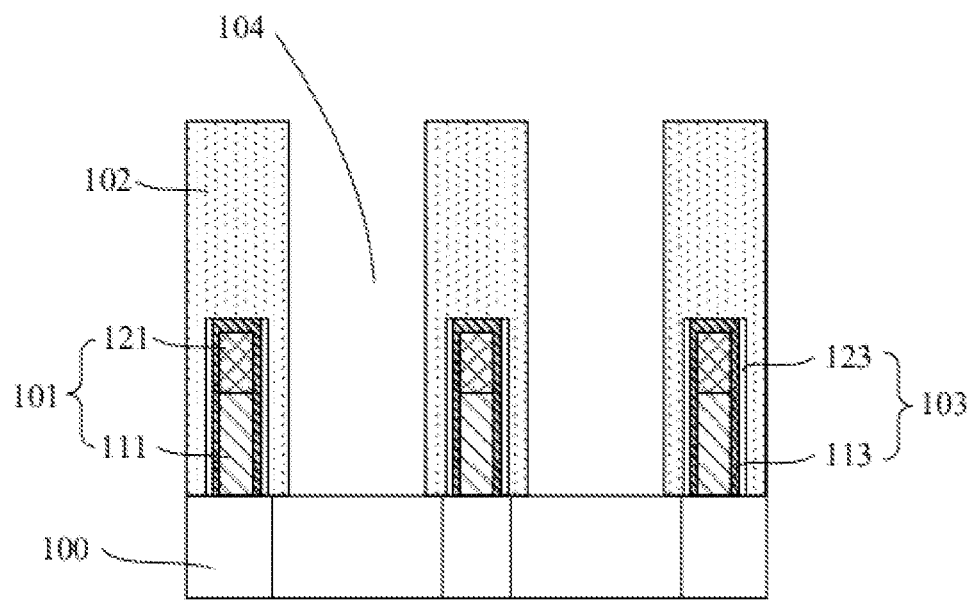

Referring to FIGS. 3 and 4, FIG. 3 is a schematic partial three-dimensional structural diagram, FIG. 4 is a schematic structural cross-sectional diagram along direction AA1 in FIG. 3, and FIG. 4 is also a schematic structural diagram based on FIG. 2. A first etching process is carried out to etch the insulating layer 102 located between the adjacent bitline conductive layers 101 to form initial capacitor contact holes 104 exposing the substrate 100, and there is an insulating layer 102 between the initial capacitor contact hole 104 and the bitline conductive layer 101.

The first etching process may be dry etching. Because the dry etching process has good anisotropy, a sidewall of the initial capacitor contact hole 104 formed is approximately perpendicular to a surface of the substrate 100.

In this embodiment, the density of the insulating layer 102 on the sidewall of the initial capacitor contact hole 104 gradually decreases in the direction along the substrate 100 and towards the insulating layer 102, so that the etching rate of the subsequent second etching process for the insulating layer 102 gradually increases.

Figure 5:
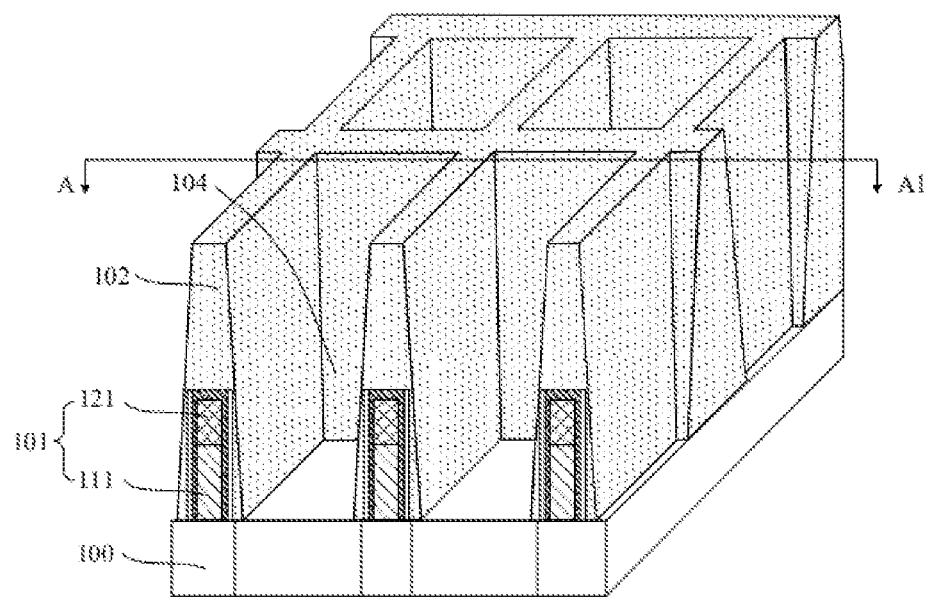
Figure 6:
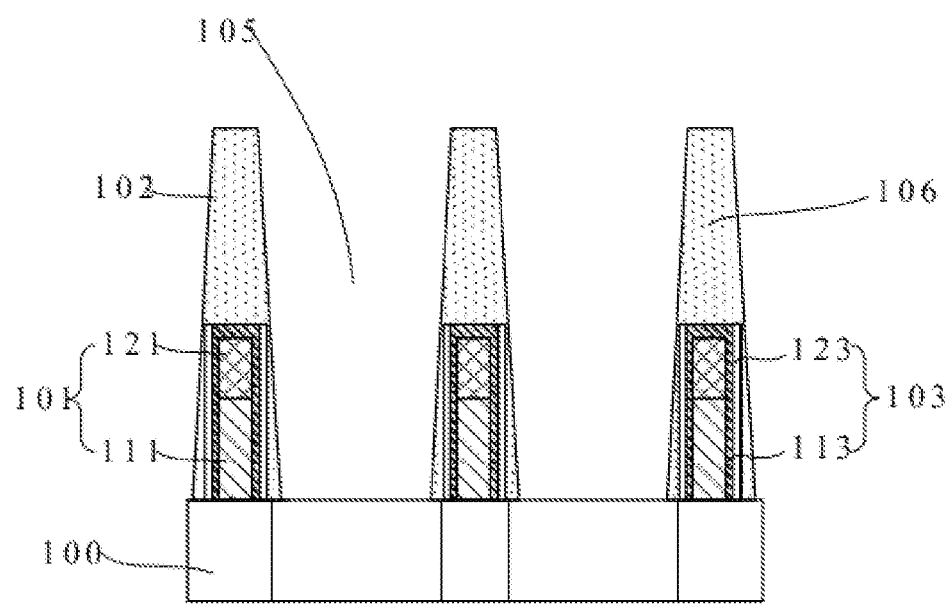

Referring to FIGS. 5 and 6, FIG. 5 is a schematic partial three-dimensional structural diagram of a memory in which capacitor contact holes 105 are formed, and FIG. 6 is a schematic structural cross-sectional diagram along direction AA1 in FIG. 5. The second etching process is carried out to etch the insulating layer 102 on the sidewalls of the initial capacitor contact holes 104 to form the capacitor contact holes 105, an opening size of the capacitor contact hole 105 gradually increases in the direction along the substrate 100 and towards the insulating layer 102, and the remaining insulating layer 102 right above the bitline conductive layer 101 serves as the bitline insulating layer 106.

Since the etching rate of the second etching process for the insulating layer 102 gradually increases in the direction along the substrate 100 and towards the insulating layer 102, the width of the insulating layer 102 etched and removed by the second etching process gradually decreases in a direction from the top of the initial capacitor contact hole 104 to the bottom, thus forming the capacitor contact hole 105 of an inverted trapezoidal shape.

Specifically, in this embodiment, an inclination angle of the insulating layer 102 on the sidewall of the capacitor contact hole 105 to the bitline conductive layer 101 is between 10° and 30°. By increasing the extent of decrease in the temperature of the deposition process for forming the insulating layer 102, the extent of decrease in the density of the insulating layer 102 in the direction along the substrate 100 and towards the insulating layer 102 becomes larger. Therefore, during the second etching process, within the same etching time, the extent of increase in the etching rate for the insulating layer 102 on the sidewall of the initial capacitor contact hole 104 becomes larger, and the inclination angle of the formed capacitor contact hole 105 to the bitline conductive layer 101 becomes larger. In other words, by adjusting the temperature change rate of the aforementioned deposition process for forming the insulating layer 102, the inclination angle of the sidewall of the capacitor contact hole 105 formed can be adjusted to a certain extent.

In addition, the inclination angle of the capacitor contact hole 105 to the bitline conductive layer 101 needs to meet the condition that the width of the insulating layer 102 between the capacitor contact hole 105 and the bitline conductive layer 101 is not less than 20 nm to 50 nm to ensure a good electrical isolation effect between the capacitor contact hole 105 and the bitline insulating layer 101.

In this embodiment, the second etching process is wet etching. Since the density of the insulating layer 102 on the sidewall of the initial capacitor contact hole 104 gradually decreases in the direction along the substrate 100 and towards the insulating layer 102 and based on the characteristic that the wet etching process has a higher etching rate for a material with a lower density, the purpose of gradually increasing the opening size of the capacitor contact hole 105 in the direction along the substrate 100 and towards the insulating layer 102 is achieved.

An etching solution used in the wet etching can be a phosphoric acid solution or a hydrofluoric acid solution. In this embodiment, the insulating layer 102 is made of silicon nitride, and then the phosphoric acid solution is adopted as the etching solution when the insulating layer 102 on the sidewall of the initial capacitor contact hole 104 is wet-etched. In other embodiments, the insulating layer 102 may also be made of silicon oxide, and then the hydrofluoric acid solution is adopted as the etching solution when the insulating layer 102 on the sidewall of the initial capacitor contact hole 104 is wet-etched.

In this embodiment, after the capacitor contact holes 105 are formed by the second etching process, capacitor contact plugs filling up the capacitor contact holes 105 are also formed.

In this embodiment, a chemical vapor deposition process is carried out to form the capacitor contact plugs. The capacitor contact plug may be made of polysilicon or a metal conductive material.

Specifically, since the opening size of the capacitor contact hole 105 gradually increases in the direction along the substrate 100 and towards the insulating layer 102, that is, the capacitor contact hole 105 in a shape with a wide opening and a narrow bottom is formed, and when the capacitor contact hole 105 is filled with polysilicon or a metal to form the capacitor contact plug, the capacitor contact hole 105 can be filled up at one time with a good filling effect, and there is no cavity in the capacitor contact plug. In addition, the capacitor contact plug is of a single-layer structure. Compared with a capacitor contact plug formed by process steps of deposition-etching-deposition, the capacitor contact plug formed in this embodiment has no obvious interface inside, which prevents impurities left after interface oxidization. Therefore, the capacitor contact plug formed in this embodiment not only has no cavity defects inside, but also no impurities left, which is beneficial to improving the conductivity of the capacitor contact plug.

In summary, according to the manufacturing method of a memory according to this embodiment, the bitline insulating layer 106 and the capacitor contact hole 105 are formed at the same time, which achieves a better filling effect of the conductive material in the capacitor contact hole 105 and is beneficial to improving the conductive performance of the capacitor contact plug formed in the capacitor contact hole 105, thereby further improving the electrical performance of the memory structure. In addition, in this embodiment, the same deposition process is carried out to form the insulating layer 102 with a gradually changing density, and there is no need to change a deposition chamber for forming the insulating layer 102, which simplifies the process steps for preparing the insulating layer 102.

A second embodiment of the present disclosure further provides a manufacturing method of a memory. This embodiment is substantially the same as the previous embodiment except that the process steps for forming the insulating layer are different. The manufacturing method of a memory according to the second embodiment of the present disclosure will be described in detail below with reference to the accompanying drawings. It should be noted that for the same or corresponding parts in the second embodiment as in the foregoing embodiment, reference may be made to the detailed description of the foregoing embodiment and it will not be repeated hereafter.

FIGS. 7 to 10 are schematic structural diagrams corresponding to various steps in a manufacturing method of a memory according to the second embodiment of the present disclosure.

Figure 7:
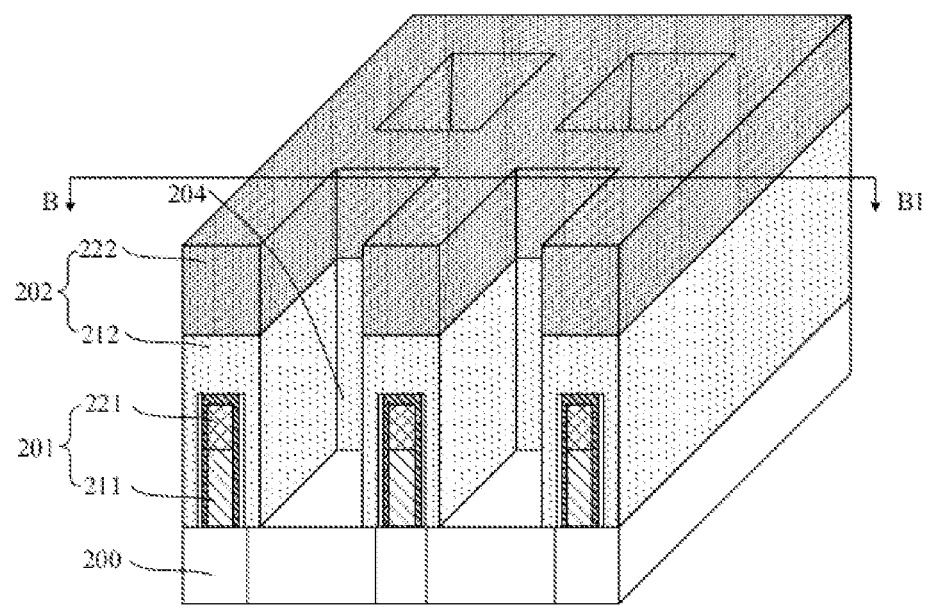
FIGS. 7 to 14 are schematic structural diagrams corresponding to various steps in a manufacturing method of a memory according to a second embodiment of the present disclosure.
Figure 8:
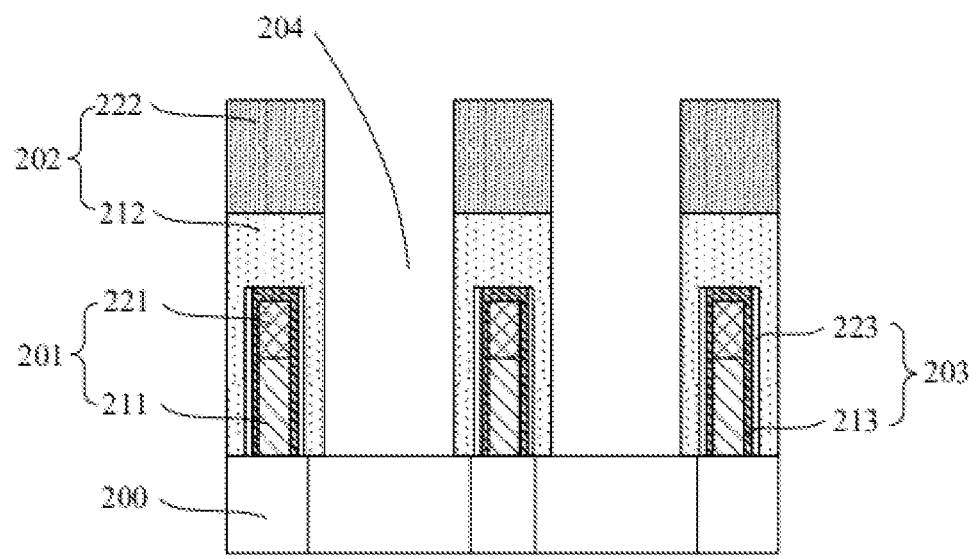

Referring to FIGS. 7 and 8, FIG. 7 is a schematic partial three-dimensional structural diagram, and FIG. 8 is a schematic structural cross-sectional diagram along direction BB1 in FIG. 7. A substrate 200 is provided, and the substrate 200 is provided with a plurality of mutually discrete bitline conductive layers 201.

Referring to FIGS. 7 and 8 again, an insulating layer 202 is formed to cover the bitline conductive layers 201 and fill a region between adjacent bitline conductive layers 201. A top surface of the insulating layer 202 is higher than the bitline conductive layer 201, and an etching rate of a subsequent second etching process for the insulating layer 202 gradually increases in a direction along the substrate 200 and towards the insulating layer 202.

In this embodiment, the insulating layer 202 is of a film-stack structure and the densities of adjacent layers with the film-stack structure gradually decrease in the direction along the substrate 200 and towards the insulating layer 202, so that the etching rate of the subsequent second etching process for the insulating layer 202 gradually increases.

Specifically, in this embodiment, the insulating layer 202 includes at least two basic insulating layers stacked in sequence, and the basic insulating layers are made of the same material. Correspondingly, the forming the insulating layer includes: sequentially stacking and forming at least two basic insulating layers. The basic insulating layers are made of the same material, and densities of the basic insulating layers at adjacent layers decrease layer by layer in the direction along the substrate 200 and towards the insulating layer 202. Since the basic insulating layers are made of the same material, the same second etching process can be subsequently carried out to etch the at least two basic insulating layers which are stacked in sequence, thereby simplifying the step of preparing a capacitor contact hole 205.

In an example, as shown in FIGS. 7 and 8, the insulating layer 202 is of a two-layer structure. The forming the insulating layer 201 includes: forming a first insulating layer 212 which is the basic insulating layer closest to the substrate 200 among the at least two basic insulating layers. In the process step of forming the insulating layer 202, a first insulating layer 212 filling up a region between the adjacent bitline conductive layers 201 is formed.

Since the first insulating layer 212 is the basic insulating layer closest to the substrate 200 and fills up the region between the adjacent bitline conductive layers 201, and when the first etching process is subsequently carried out to form initial capacitor contact holes 204, the sidewalls of the initial capacitor contact holes 204 expose the first insulating layer 212; in this case, during the subsequent second etching process, the first insulating layer 212 will also be etched to meet the requirement that the etching ratio of the second etching process for the insulating layer 202 on the sidewall of the initial capacitor contact hole 204 gradually increases in a direction from the bottom of the initial capacitor contact hole 204 to the top. In addition, the step of forming the insulating layer 202 further includes: forming a top insulating layer 222 which is the basic insulating layer farthest from the substrate 200 among the at least two basic insulating layers.

The first insulating layer 212 is formed using an atomic layer deposition process, and the top insulating layer 222 is formed using a chemical vapor deposition process. At the same deposition process temperature, the density of the first insulating layer 212 formed by the atomic layer deposition process is greater than the density of the top insulating layer 222 formed by the chemical vapor deposition process. Specifically, in this embodiment, the process temperature range of the atomic layer deposition and the process temperature range of the chemical vapor deposition are the same and both between 620° C. and 640° C. In other embodiments, the process temperature of the atomic layer deposition may also be lower than the process temperature of the chemical vapor deposition, and in this case the density of the basic insulating layers at adjacent layers also can decrease layer by layer in the direction along the substrate 200 and towards the insulating layer 202.

Alternatively, the first insulating layer 212 and the top insulating layer 222 are formed using the same deposition process, and the temperature of the deposition process for forming the first insulating layer 212 is greater than the temperature of the deposition process for forming the top insulating layer 222. In the same deposition process, the lower the deposition process temperature, the lower the density of the basic insulating layer formed, and thus the densities of the basic insulating layers at adjacent layers can decrease layer by layer in the direction along the substrate 200 and towards the insulating layer 202. In addition, the same deposition process is carried out to form the insulating layer 202 with a density decreasing layer by layer, and there is no need to change a deposition chamber for forming the insulating layer 202, which simplifies the process steps for preparing the insulating layer 202. In other embodiments, the density of the same basic insulating layer may also gradually decrease in the direction along the substrate 200 and towards the insulating layer 202. Regardless of the complexity in forming the insulating layer 202, the density of the same basic insulating layer can gradually decrease by gradually lowering the deposition process temperature.

In this embodiment, a height of the top insulating layer 222 formed by the deposition process in a direction along the substrate 200 and towards the insulating layer 202 is not less than 50nm to 150nm, so that the height of the top insulating layer 222 formed subsequently on the sidewall of the capacitor contact hole 205 will not be too low; in this way, during the deposition process of forming the conductive material for filling up the capacitor contact hole 205, when the inside of the capacitor contact hole 205 is not completely filled, the top opening of the capacitor contact hole 205 will not be blocked by the conductive material prematurely, and there will be no cavity in the formed capacitor contact plug, thus ensuring that the capacitor contact plug has good conductive performance. In addition, in the direction along the substrate 200 and towards the insulating layer 202, a total height of the top insulating layer 222 and the first insulating layer 212 is within a range of 100 nm to 300 nm.

Figure 9:
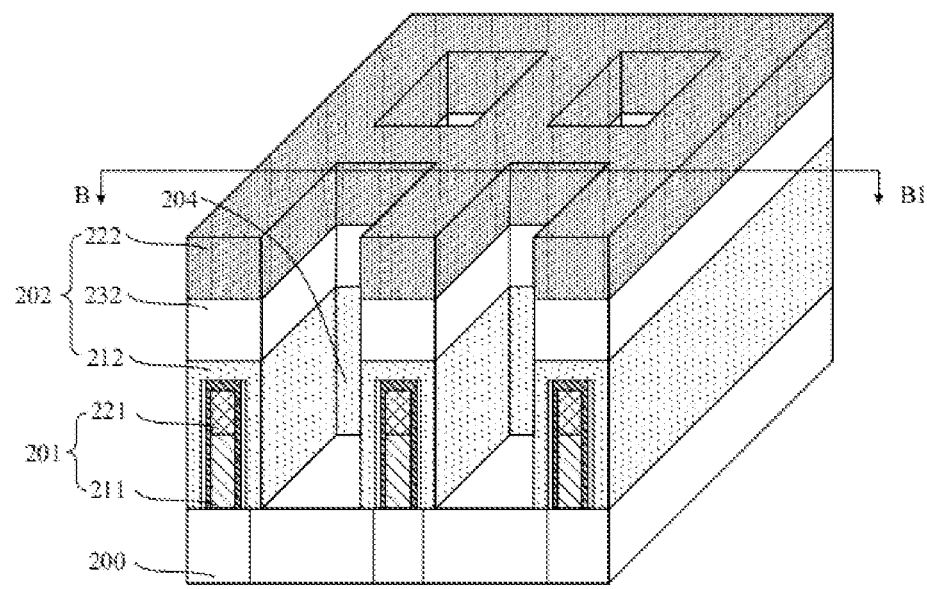
Figure 10:
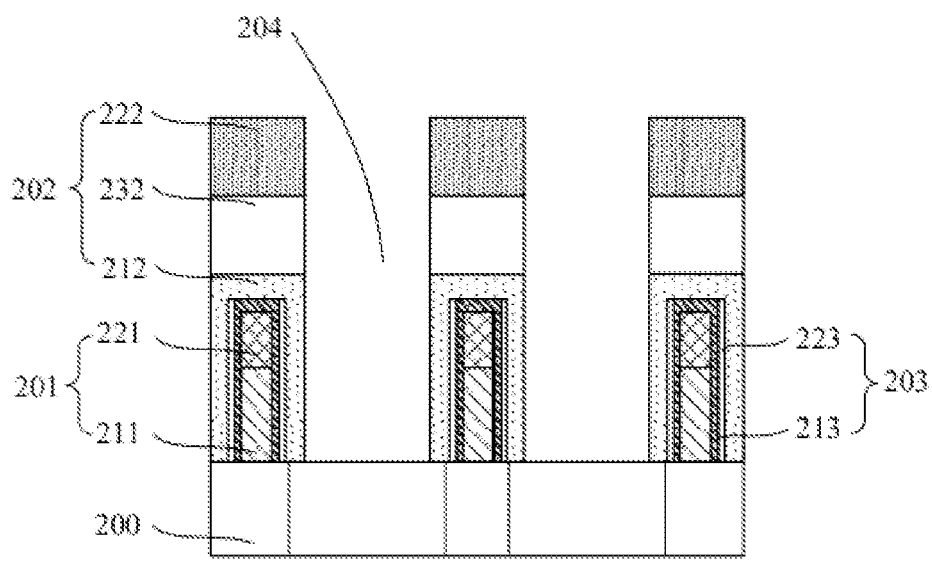

In another example, referring to FIGS. 9 and 10, FIG. 10 is a schematic structural cross-sectional diagram along direction BB1 in FIG. 9. The insulating layer 202 may be of a three-layer structure. In addition to the first insulating layer 212 and the top insulating layer 222, the insulating layer 202 further includes a second insulating layer 232. Specifically, after forming the first insulating layer 212 and before forming the top insulating layer 222, the second insulating layer 232 is formed on the first insulating layer 212 and the bitline conductive layer 201; the top insulating layer 222 is formed on the second insulating layer 232; and the first insulating layer 212, the second insulating layer 232, and the top insulating layer 222 are made of the same material. The etching rate of the second etching process for the top insulating layer 222, the second insulating layer 232, and the first insulating layer 212 gradually decreases.

The first insulating layer 212 is formed using an atomic layer deposition process; the second insulating layer 232 and the top insulating layer 222 are formed using a chemical vapor deposition process. The temperature of the deposition process for forming the top insulating layer 222 is lower than the temperature of the deposition process for forming the second insulating layer 232. Specifically, in this embodiment, the temperature of the deposition process for forming the first insulating layer 212 is the same as the temperature of the deposition process for forming the second insulating layer 232; the temperature of the deposition process for forming the second insulating layer 232 is within a range of 620° C. to 640° C.; and the temperature of the deposition process for forming the top insulating layer 222 is within a range of 600° C. to 620° C. It can be understood that, in other embodiments, without considering the deposition process cost, the insulating layer 202 may also be of a structure with more than three layers.

In this embodiment, in the direction from the substrate 200 towards the insulating layer 202, the height of the second insulating layer 232 formed by the deposition process is not less than 25nm to 75nm, and a total height of the first insulating layer 212, the second insulating layer 232, and the top insulating layer 222 is within a range of 100 nm to 300 nm.

FIGS. 7 and 8, the first etching process is carried out to etch the insulating layer 202 between the adjacent bitline conductive layers 201 to form initial capacitor contact holes 204 exposing the substrate 200, and the sidewalls of the initial capacitor contact holes 204 expose the first insulating layer 212 and the top insulating layer 222.

The density of the first insulating layer 212 is greater than that of the top insulating layer 222 and the sidewalls of the initial capacitor contact holes 204 expose the first insulating layer 212 and the top insulating layer 222; therefore, during the subsequent second etching process, both the first insulating layer 212 and the top insulating layer 222 will be etched, the width of the etched first insulating layer 212 is less than the width of the etched top insulating layer 222 within the same etching time, and then the capacitor contact hole 205 in a shape with a wide opening and a narrow bottom can be formed.

In another example, referring to FIGS. 9 and 10 again, the first etching process is carried out to etch the insulating layer 202 located between the adjacent bitline conductive layers 201 to form the initial capacitor contact holes 204 exposing the substrate 200,and the sidewalls of the initial capacitor contact holes 204 expose the first insulating layer 212, the second insulating layer 232, and the top insulating layer 222.

The density of the first insulating layer 212, the second insulating layer 232, and the top insulating layer 222 decreases layer by layer and the sidewalls of the initial capacitor contact holes 204 expose the first insulating layer 212, the second insulating layer 232, and the top insulating layer 222; therefore, during the subsequent second etching process, the first insulating layer 212, the second insulating layer 232, and the top insulating layer 222 will all be etched, the width of the etched first insulating layer 212, the width of the etched second insulating layer 232, and the width of the etched top insulating layer 222 increase layer by layer within the same etching time, and then the capacitor contact hole 205 in a shape with a wide opening and a narrow bottom can be formed.

Figure 11:
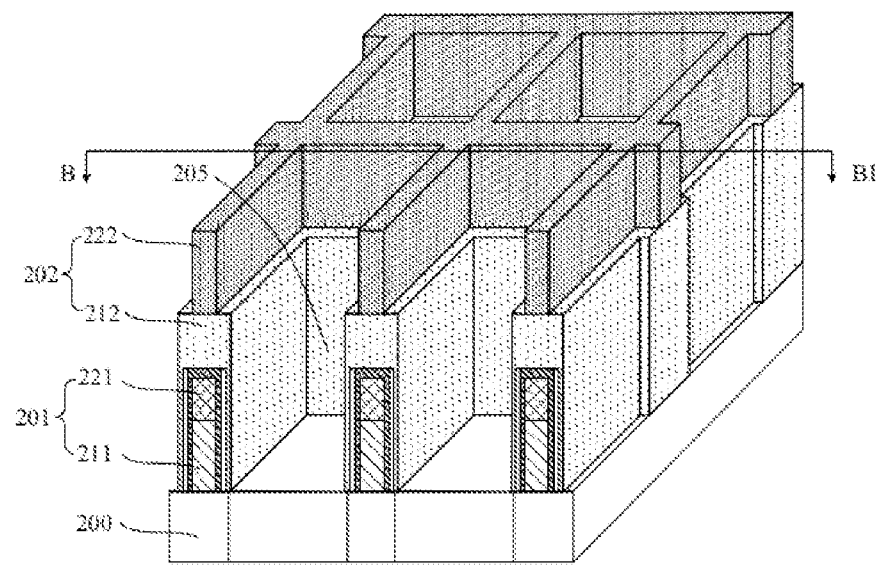
Figure 12:
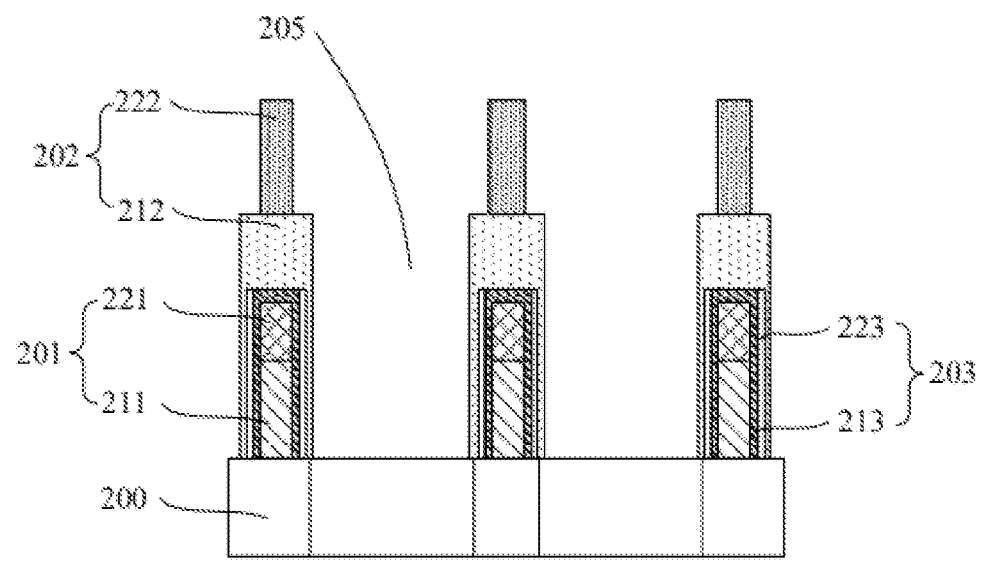

Referring to FIGS. 11 and 12, the insulating layer 202 is of a two-layer structure, the second etching process is carried out to etch the insulating layer 202 on the sidewalls of the initial capacitor contact holes 204 to form the capacitor contact holes 205, an opening size of the capacitor contact hole 205 gradually increases in the direction along the substrate 200 and towards the insulating layer 202, and the remaining insulating layer 102 right above the bitline conductive layer 201 serves as the bitline insulating layer.

After the second etching process is carried out, the first insulating layer 212 and the top insulating layer 222 right above the bitline conductive layer 201 both serve as bitline insulating layers, and the etching rate of the second etching process for the first insulating layer 212 is lower than the etching rate for the top insulating layer 222; therefore, the width of the etched first insulating layer 212 is less than the width of the etched top insulating layer 222 within the same etching time, and then the stepped capacitor contact hole 205 as shown in FIG. 11 can be formed.

Specifically, the capacitor contact hole 205 includes: a first through hole penetrating the first insulating layer 212 and a second through hole penetrating the top insulating layer 222.

By controlling the etching time of the second etching process, in a direction perpendicular to an extension direction of the bitline conductive layer 201, the opening widths of through holes, in the adjacent layers, in the capacitor contact holes 205 differ by 6 nm to 10 nm, and the opening width of the second through hole, penetrating the top insulating layer 222, in the capacitor contact hole 205 is within a range of 30 nm to 60 nm. Specifically, when the opening width of the first through hole and the opening width of the second through hole differ by 6 nm to 10 nm in this embodiment, a good filling effect of the conductive material in the capacitor contact hole 205 can be ensured, and the top insulating layer 222 in the bitline insulating layer is not too narrow, thus meeting the hardness requirement of the bitline insulating layer. In addition, after the second etching process is carried out, the width of the first insulating layer 212 between the capacitor contact hole 205 and the bitline insulating layer 201 is not less than 5 nm to ensure the electrical isolation effect between the capacitor contact hole 205 and the bitline insulation layer 201.

Figure 13:
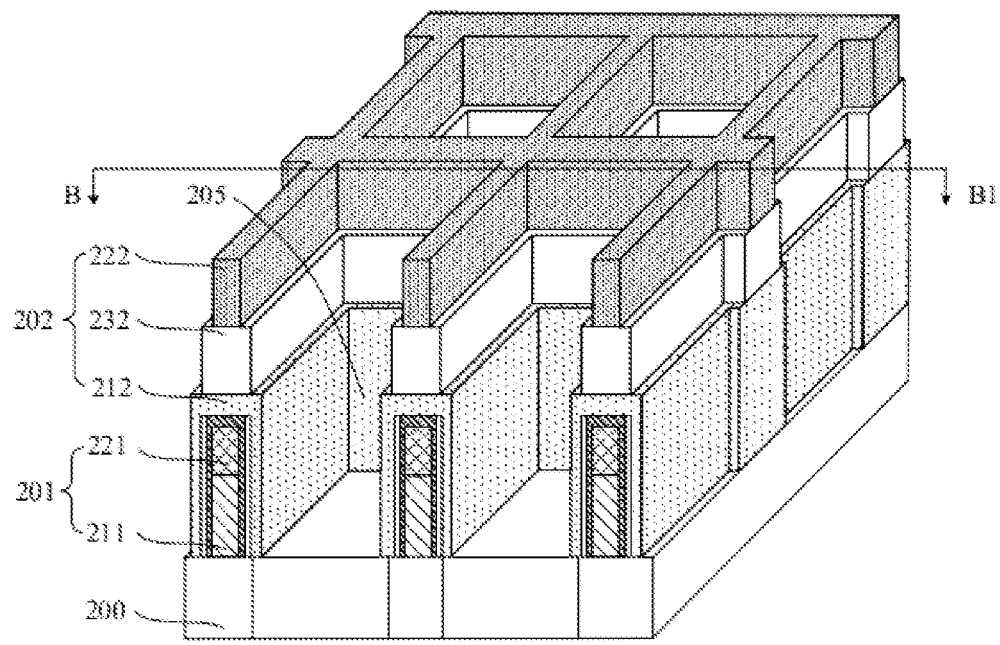
Figure 14:
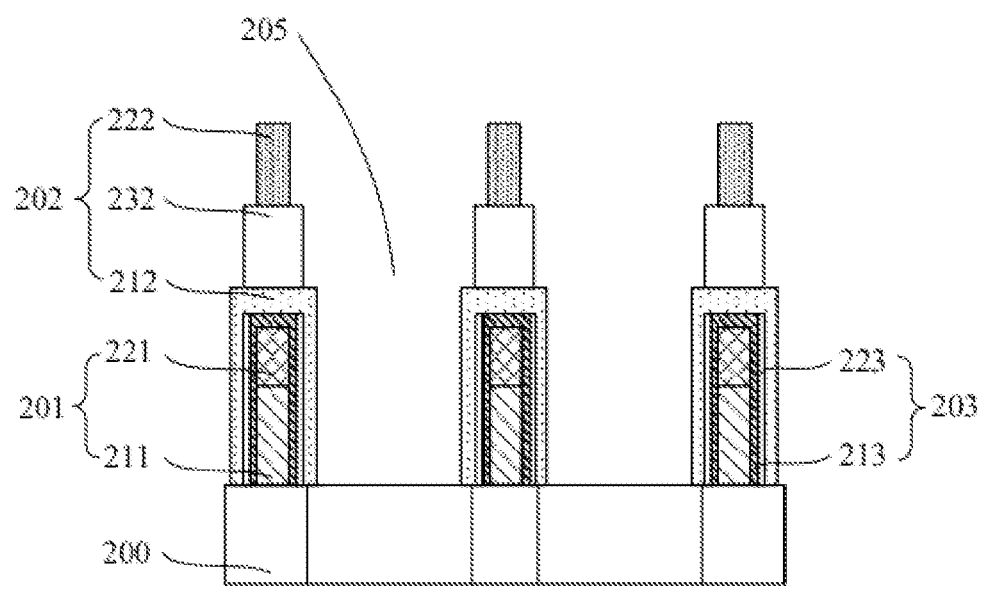

In another example, referring to FIGS. 13 and 14, the insulating layer 202 is of a three-layer structure, the second etching process is carried out to etch the insulating layer 202 on the sidewalls of the initial capacitor contact holes 204 to form the capacitor contact holes 205, an opening size of the capacitor contact hole 205 gradually increases in the direction along the substrate 200 and towards the insulating layer 202, and the remaining insulating layer 102 right above the bitline conductive layer 201 serves as the bitline insulating layer.

After the second etching process is carried out, the first insulating layer 212, the second insulating layer 232 and the top insulating layer 222 right above the bitline conductive layer 201 all serve as bitline insulating layers, and the etching rate of the second etching process for the first insulating layer 212, the second insulating layer 232 and the top insulating layer 222 increases layer by layer; therefore, the width of the etched first insulating layer 212, the width of the etched second insulating layer 232, and the width of the etched top insulating layer 222 increase layer by layer within the same etching time, and then the stepped capacitor contact hole 205 as shown in FIG. 13 can be formed.

Specifically, the capacitor contact hole 205 includes: a first through hole penetrating the first insulating layer 212, a third through hole penetrating the second insulating layer 232, and a second through hole penetrating the top insulating layer 222.

By controlling the etching time of the second etching process, in a direction perpendicular to an extension direction of the bitline conductive layer 201, a difference between the opening width of the first through hole and the opening width of the third through hole and a difference between the opening width of the third through hole and the opening width of the second through hole are both within a range of 6 nm to 10 nm, and the opening width of the second through hole is within a range of 30 nm to 60 nm.

The subsequent process steps include: forming a capacitor contact plug filling up the capacitor contact hole 205.

Compared with the foregoing embodiment, in this embodiment, since the insulating layer 202 is of a multilayer structure, by controlling the size of the first through hole, it can be ensured that the sidewall of the bitline conductive layer 201 still has a sufficient thickness of the insulating layer 202 to provide insulation protection; by adjusting the opening size of the third through hole and the opening size of the second through hole, the size of the capacitor contact hole 205 formed can be larger, and more conductive material is filled into the capacitor contact hole 205, so the conductive performance of the capacitor contact plug in this embodiment is better, which is beneficial to further improving the electrical performance of the memory.

A third embodiment of the present disclosure further provides a memory, and the memory can be formed by the manufacturing method according to any of the foregoing embodiments. The memory includes: a substrate with a plurality of mutually discrete bitlines, the bitline including a bitline conductive layer and a bitline insulating layer which are stacked in sequence; and an insulating layer and capacitor contact holes, the insulating layer being located on sidewalls of the bitline conductive layers and sidewalls of the bitline insulating layers, the capacitor contact holes being located between adjacent ones of the bitline conductive layers, sidewalls of the capacitor contact holes exposing the insulating layer, an opening size of the capacitor contact hole gradually increasing in a direction along the substrate and towards the insulating layer.

In an example, as shown in FIGS. 5 and 6, the memory includes: a substrate 100 with a plurality of mutually discrete bitlines, the bitline including a bitline conductive layer 101 and a bitline insulating layer 106 which are stacked in sequence; and an insulating layer 102 and capacitor contact holes 105, the insulating layer 102 being located on sidewalls of the bitline conductive layers 101 and sidewalls of the bitline insulating layers 106, the capacitor contact holes 105 being located between adjacent ones of the bitline conductive layers 101, sidewalls of the capacitor contact holes 105 exposing the insulating layer 102, an opening size of the capacitor contact hole 105 gradually increasing in a direction along the substrate 100 and towards the insulating layer 102.

The bitline insulating layer 106 and the insulating layer 102 are of an integral structure.

In addition, the insulating layer 102 is of a single-layer structure, and the density of the insulating layer gradually decreases in the direction along the substrate 100 and towards the insulating layer 102. Correspondingly, in a direction perpendicular to the surface of the substrate 100, a cross-sectional shape of the capacitor contact hole 105 is an inverted trapezoidal shape.

In this embodiment, with respect to the direction along the substrate 100 and towards the insulating layer 102, an inclination angle of the insulating layer 102 on the sidewall of the capacitor contact hole 105 is within a range of 10° to 30°. The opening size of the capacitor contact hole 105 gradually increases in the direction along the substrate 100 and towards the insulating layer 102, which achieves a better filling effect of a conductive material in the capacitor contact hole 105 and is beneficial to improving the conductive performance of the capacitor contact plug formed by filling, thereby further improving the electrical performance of the memory structure.

In another example, as shown in FIGS. 9 and 10, the memory includes: a substrate 200, a bitline conductive layer 201, a bitline insulating layer (not denoted), an insulating layer 202, and capacitor contact holes 205, wherein the insulating layer 202 includes: at least two basic insulating layers stacked in sequence, the basic insulating layers are made of the same material, and in the direction along the substrate 200 and towards the insulating layer 202, the densities of the basic insulating layers at adjacent layers gradually decrease, the basic insulating layer in the two basic insulating layers closest to the substrate 200 serves as a first insulating layer 212, a top of the first insulating layer 212 is flush with a top of the bitline conductive layer 201 or higher than the top of the bitline conductive layer 201 to ensure that the sidewalls of the capacitor contact holes 205 expose the first insulating layer 212 and the top insulating layer 222. The bitline insulating layer and the insulating layer 202 are of an integral structure.

In addition, in a direction perpendicular to an extension direction of the bitline conductive layer 201, a width difference between the first insulating layer 212 and the second insulating layer 222 is within a range of 6 nm to 10 nm, and a height of the top insulating layer 222 is not less than 50 nm. In this way, during the deposition process of forming the conductive material for filling up the capacitor contact hole 205, when the inside of the capacitor contact hole 205 is not completely filled, a top opening of the capacitor contact hole 205 will not be blocked by the conductive material prematurely, and there will be no cavity in the formed capacitor contact plug, thus ensuring that the capacitor contact plug has good conductive performance.

In another example, as shown in FIGS. 13 and 14, the insulating layer 202 further includes: a second insulating layer 232, and the second insulating layer 232 is located on a side of the first insulating layer 212 away from the substrate 200.

Since the insulating layer 202 is of a three-layer structure, the size of the capacitor contact hole 205 is larger, and during the formation of a capacitor contact plug, the capacitor contact hole 205 is filled with more conductive material in this embodiment. Therefore, in this embodiment, the capacitor contact plug has better conductive performance, which is beneficial to further improving the electrical performance of the memory.

The technical solution provided by the present disclosure has the following advantages:

The manufacturing method of a memory according to embodiments of the present disclosure includes: forming an insulating layer, the insulating layer covering bitline conductive layers and filling a region between adjacent ones of the bitline conductive layers; carrying out a first etching process to etch an insulating layer located between the adjacent bitline conductive layers to form initial capacitor contact holes exposing the substrate and having a relatively large depth; and carrying out a second etching process to etch the insulating layer on sidewalls of the initial capacitor contact holes to form capacitor contact holes, an etching rate of the second etching process for the insulating layer gradually increasing in a direction along the substrate and towards the insulating layer, an opening size of the capacitor contact hole gradually increasing in the direction along the substrate and towards the insulating layer, the remaining insulating layer right above the bitline conductive layer serving as a bitline insulating layer. In the embodiments of the present disclosure, a process of forming the bitline insulating layers is used to form capacitor contact holes of a special shape, that is, when the bitline insulating layers are formed, the formed capacitor contact hole is in a shape with a wide opening and a narrow bottom. Therefore, process windows for filling a conductive material in the capacitor contact holes are increased, and a better filling effect of the conductive material in the capacitor contact holes is achieved, which avoids a problem of cavities caused when the capacitor contact holes are subsequently filled with the conductive material and is beneficial to improving the conductive performance of a capacitor contact plug formed in the capacitor contact hole, thus further improving the electrical performance of a memory structure.

In addition, the insulating layer is of a single-layer structure, and a process temperature during the deposition of the insulating layer can be conditioned to achieve a gradual decrease in the density of the insulating layer in the direction along the substrate and towards the insulating layer. Specifically, in the direction along the substrate and towards the insulating layer, since the temperature of the deposition process adopted gradually decreases, the etching rate of the second etching process for the insulating layer gradually increases. Within the same etching time, a width of the etched insulating layer gradually increases, thereby forming the capacitor contact holes in a shape with a wide opening and a narrow bottom.

In addition, the step of forming the insulating layer includes: sequentially stacking and forming at least two basic insulating layers, the basic insulating layers being made of the same material, densities of the basic insulating layers at adjacent layers decreasing layer by layer in the direction along the substrate and towards the insulating layer. Moreover, in the process step of forming the initial capacitor contact holes, the sidewalls of the initial capacitor contact holes expose each basic insulating layer. When the second etching process is carried out on the initial capacitor contact holes, since the sidewalls of the initial capacitor contact holes expose each basic insulating layer and the density of the basic insulating layers at the adjacent layers decreases layer by layer, widths of the etched basic insulating layers at the adjacent layers increase layer by layer within the same etching time, thereby forming the capacitor contact holes in a shape with a wide opening and a narrow bottom.

It should be understood that the above-mentioned specific embodiments of the present disclosure are only used to illustrate or explain the principle of the present disclosure in an exemplary way, and do not constitute a limitation on the present disclosure. Therefore, any modification, equivalent replacement, improvement, and the like made without departing from the spirit and scope of the present disclosure should be included in the protection scope of the present disclosure. In addition, the appended claims of the present disclosure are intended to cover all changes and modifications that fall within the scope and boundary of the appended claims, or equivalent forms of such scope and boundary.

What is claimed is:

1. A manufacturing method of a memory, comprising:
providing a substrate with a plurality of mutually discrete bitline conductive layers;
forming an insulating layer, the insulating layer covering the bitline conductive layers and filling a region between adjacent ones of the bitline conductive layers, a top surface of the insulating layer being higher than the bitline conductive layer, and an etching rate of a subsequent second etching process for the insulating layer gradually increasing in a direction along the substrate and towards the insulating layer;
carrying out a first etching process to etch the insulating layer located between the adjacent bitline conductive layers to form initial capacitor contact holes exposing the substrate; and
carrying out the second etching process to etch the insulating layer on sidewalls of the initial capacitor contact holes to form capacitor contact holes, an opening size of the capacitor contact hole gradually increasing in the direction along the substrate and towards the insulating layer, the remaining insulating layer right above the bitline conductive layer serving as a bitline insulating layer.

2. The manufacturing method of a memory according to claim 1, wherein before the second etching process, a density of the insulating layer on the sidewall of the initial capacitor contact hole gradually decreases in the direction along the substrate and towards the insulating layer.

3. The manufacturing method of a memory according to claim 1, wherein the insulating layer is of a single-layer structure; the insulating layer is formed by a deposition process, and a process temperature of the deposition process gradually decreases.

4. The manufacturing method of a memory according to claim 1, wherein the forming the insulating layer comprises:
sequentially stacking and forming at least two basic insulating layers, the basic insulating layers being made of the same material, densities of the basic insulating layers at adjacent layers decreasing layer by layer in the direction along the substrate and towards the insulating layer;
and in the process step of forming the initial capacitor contact holes, the sidewalls of the initial capacitor contact holes expose each of the basic insulating layers.

5. The manufacturing method of a memory according to claim 4, wherein before the first etching process, the forming the insulating layer comprises:
forming a first insulating layer, the first insulating layer filling up a region between the adjacent bitline conductive layers, the first insulating layer being the basic insulating layer closest to the substrate among the at least two basic insulating layers.

6. The manufacturing method of a memory according to claim 5, wherein before the first etching process, the forming the insulating layer further comprises:
forming a top insulating layer which is the basic insulating layer farthest from the substrate among the at least two basic insulating layers; and forming the first insulating layer using an atomic layer deposition process, and forming the top insulating layer using a chemical vapor deposition process; or,
forming the first insulating layer and the top insulating layer using the same deposition process, a temperature of the deposition process for forming the first insulating layer being greater than a temperature of the deposition process for forming the top insulating layer.

7. The manufacturing method of a memory according to claim 6, wherein the process step of forming the insulation layer comprises:
after forming the first insulating layer and before forming the top insulating layer, forming a second insulating layer on the first insulating layer and the bitline conductive layer; and
forming the top insulating layer on the second insulating layer, the first insulating layer, the second insulating layer, and the top insulating layer being made of the same material, the etching rate of the second etching process for the top insulating layer, the second insulating layer, and the first insulating layer gradually decreasing.

8. The manufacturing method of a memory according to claim 7, wherein the first insulating layer is formed using an atomic layer deposition process;

the second insulating layer and the top insulating layer are formed using a chemical vapor deposition process; and a temperature of the deposition process for forming the top insulating layer is lower than a temperature of the deposition process for forming the second insulating layer.

9. The manufacturing method of a memory according to claim 8, wherein the temperature of the deposition process for forming the second insulating layer is within a range of 620° C.to 640° C.; and the temperature of the deposition process for forming the top insulating layer is within a range of 600° C.to 620° C.

10. The manufacturing method of a memory according to claim 8, wherein the temperature of the deposition process for forming the first insulating layer is the same as the temperature of the deposition process for forming the second insulating layer.

11. The manufacturing method of a memory according to claim 1, wherein the insulating layer is made of silicon nitride or silicon oxide.

12. The manufacturing method of a memory according to claim 1, wherein the second etching process comprises wet etching.

13. The manufacturing method of a memory according to claim 12, wherein an etching solution used in the wet etching can be a phosphoric acid solution or a hydrofluoric acid solution.

14. The manufacturing method of a memory according to claim 1, further comprising:

forming a capacitor contact plug filling the capacitor contact hole.

* * * * *